(12) United States Patent
Vice (10) Patent No.: US 7,679,417 B2
(45) Date of Patent: Mar. 16, 2010

(54) ATTENUATOR WITH BIAS CONTROL CIRCUIT

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/170,785

(22) Filed: Jul. 10, 2008

(65) Prior Publication Data
US 2010/0007421 A1    Jan. 14, 2010

(51) Int. Cl.
*H03L 5/20* (2006.01)
(52) U.S. Cl. .................................... 327/308; 333/81 R
(58) Field of Classification Search ............. 327/306, 327/308; 333/81 R
See application file for complete search history.

(56) References Cited

U.S. PATENT DOCUMENTS

| | | | | |
|---|---|---|---|---|
| 4,787,686 A | * | 11/1988 | Tajima et al. ............... | 327/308 |
| 5,903,177 A | * | 5/1999 | Schwab et al. .............. | 327/308 |
| 6,489,856 B1 | * | 12/2002 | Weigand .................... | 333/81 R |
| 7,221,207 B2 | * | 5/2007 | Fukumoto et al. ........... | 327/365 |
| 7,250,804 B2 | * | 7/2007 | Brindle ....................... | 327/365 |

* cited by examiner

*Primary Examiner*—Dinh T. Le (57) ABSTRACT

An attenuator includes one or more series attenuation branches including one or more series field effect transistors (FETs) each having a gate; one or more shunt attenuation branches including one or more shunt FETs each having a gate; and a bias control FET. The bias control FET receives at its gate a first bias control signal and in response thereto produces at one of its drain and source terminals a second bias control signal. Either the first bias control signal is coupled to the gates of one or more series FETs, and the second bias control signal is coupled to the gates of the one or more shunt FETs; or the first bias control signal is coupled to the gates of the one or more shunt FETs, and the second bias control signal is coupled to the gates of the one or more series FETs.

19 Claims, 7 Drawing Sheets

ATTENUATOR WITH BIAS CONTROL CIRCUIT

BACKGROUND

Radio Frequency (RF) signals and components are employed in a variety of devices, including mobile communication devices such as mobile telephones. One type of commonly employed RF component is an RF attenuator, which is sometimes employed to control an RF signal level in a device that employs RF signals.

Figure 1:
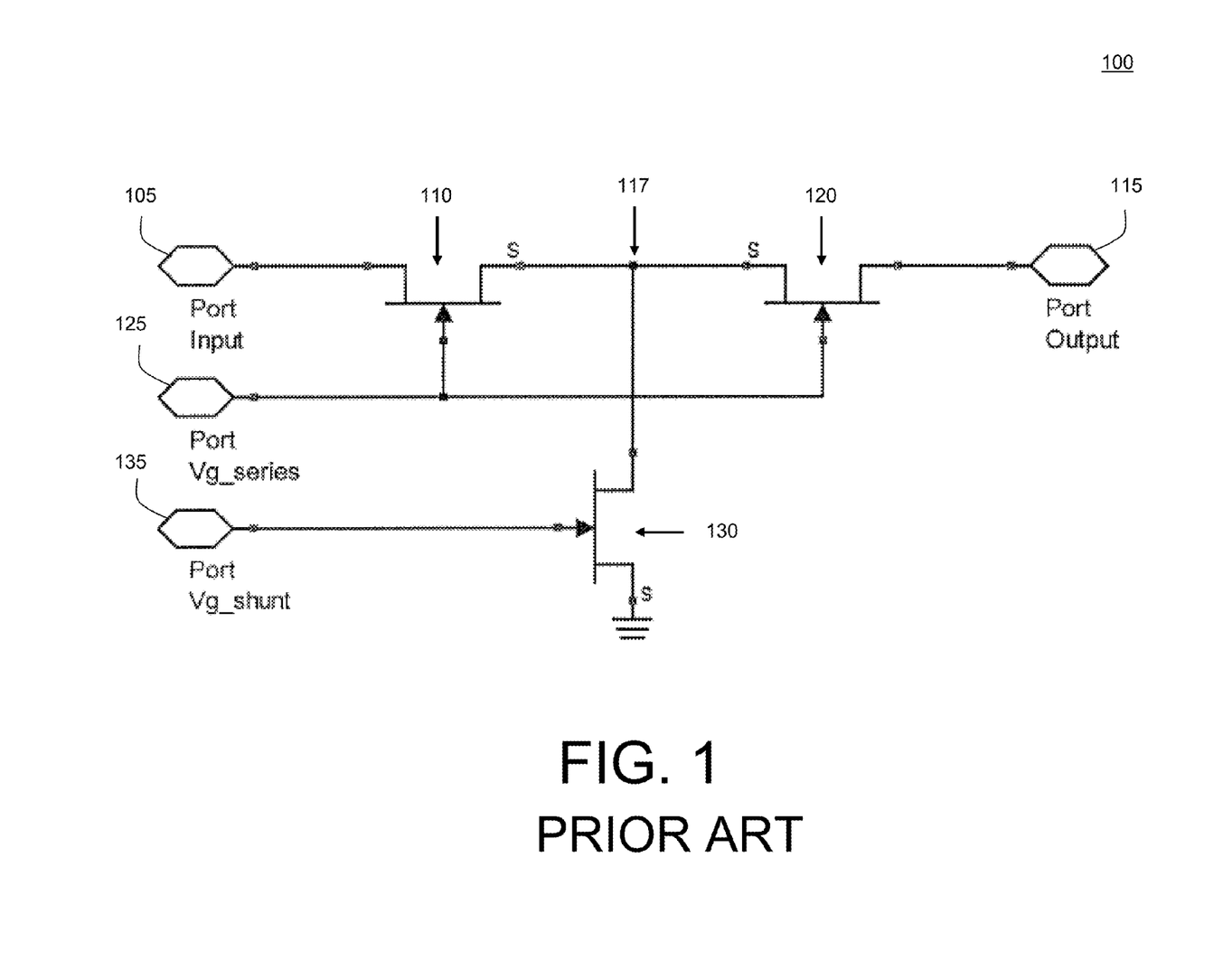
FIG. 1 shows a schematic diagram of an attenuator.

FIG. 1 illustrates a basic configuration of a series-shunt field effect transistor (FET) attenuator 100. Attenuator 100 includes an input port 105 and an output port 115. Attenuator 100 also includes a first series attenuation branch, or arm, including a first series field effect transistor 110, connected in series with a second series attenuation branch, or arm, including a second series field effect transistor 120, between input port 105 and output port 115 via an intermediate node 117. Also, a shunt attenuation branch, or arm including a shunt field effect transistor 130 is connected between intermediate node 117 and ground.

Attenuator 100 includes two attenuation control ports 125 and 135 which receive a series attenuation control signal Vg_series and a shunt attenuation control signal Vg_shunt, respectively. The series attenuation control signal Vg_series is applied to the gates of first and second series field effect transistors 110 and 120, and the shunt attenuation control signal Vg_shunt is applied to the gate of shunt series field effect transistor 130.

Effectively, first and second series field effect transistors 110 and 120 and shunt field effect transistor 130 are operated as voltage controlled impedances to attenuate an input signal, particularly an RF input signal, received at input port 105 and to provide the attenuated signal at output port 115. The voltages Vg_series and Vg_shunt are selected so that they operate in combination to provide a desired attenuation (e.g., X dB) while also maintaining desired input and output impedance values (e.g., 50Ω) within a desired tolerance.

Unfortunately, maintaining the relationship between Vg_series and Vg_shunt to satisfy these requirements can be complicated.

Figure 2:
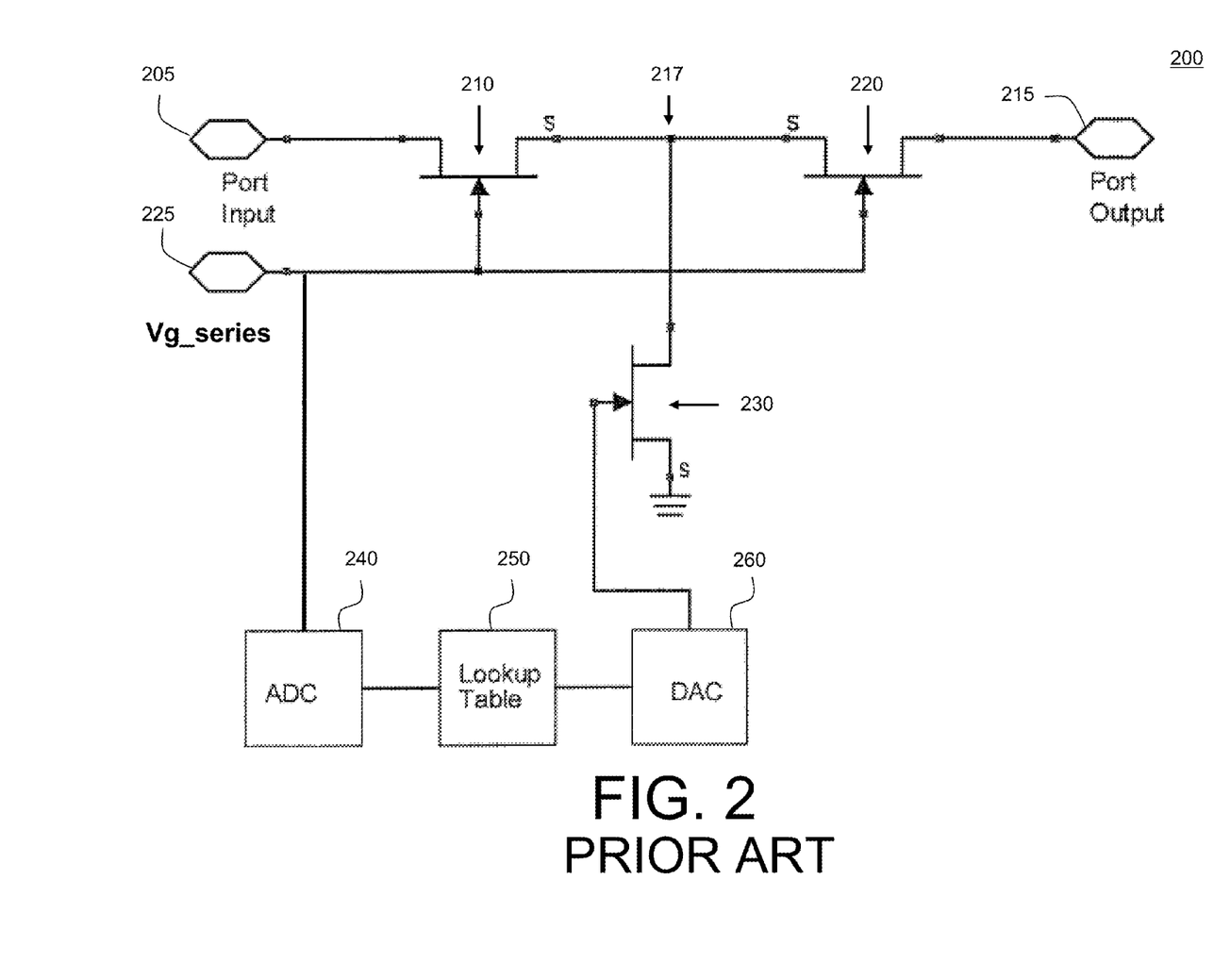
FIG. 2 shows a schematic diagram of another attenuator.

FIG. 2 shows a schematic diagram of an attenuator 200 that is designed to try to address this problem. Attenuator 200 includes an input port 205 and an output port 215. Attenuator 200 also includes a first series attenuation arm, including a first series field effect transistor 210, connected in series with a second series attenuation arm, including a second series field effect transistor 220, between input port 205 and output port 215 via an intermediate node 217. Also, a shunt attenuation arm including a shunt field effect transistor 230 is connected between intermediate node 217 and ground. Attenuator 200 includes one attenuation control port 225 which receive a series attenuation control signal Vg_series. Attenuator 200 also includes analog-to-digital converter (ADC) 240, look-up table 250, and digital-to-analog converter (DAC) 260.

In attenuator 200, for each attenuation value, X, there exists a value of the attenuation control signal voltage Vg_series (X), and a corresponding value for Vg_shunt(X), which together yield the desired attenuation X, while also maintaining the desired input and output impedances. When attenuator 200 is designed and constructed, for each desired attenuation value X the corresponding values of Vg_series(X) and Vg_shunt(X) are determined that also maintain the desired input/output impedances. Vg_series(X) and Vg_shunt(X) are each "digitized"—i.e., converted to digital words. The digital word for Vg_shunt(X) is then stored in look-up table 250 at an "address" corresponding a digital word for Vg_series(X).

In operation, when a particular attenuation value X is to be selected and applied by attenuator 200 to an input signal (e.g., an RF input signal), then the corresponding attenuation control signal voltage Vg_series(X) is applied to attenuation control port 225. Vg_series(X) is converted by ADC 240 to a digital address for addressing look-up table 250. Look-up table 250 then outputs a digital word representing the corresponding value for Vg_shunt(X). Finally, DAC 260 converts the digital word from look-up table 250 to produce the analog voltage Vg_shunt(X) which is then applied to shunt field effect transistor 230.

However, the attenuator 200 of FIG. 2 is complicated, requiring a number of additional circuits beyond the simple attenuator 100 of FIG. 1. Furthermore, attenuator 200 lacks provisions for addressing variations in the attenuator response due to process variations and temperature changes.

Figure 3:
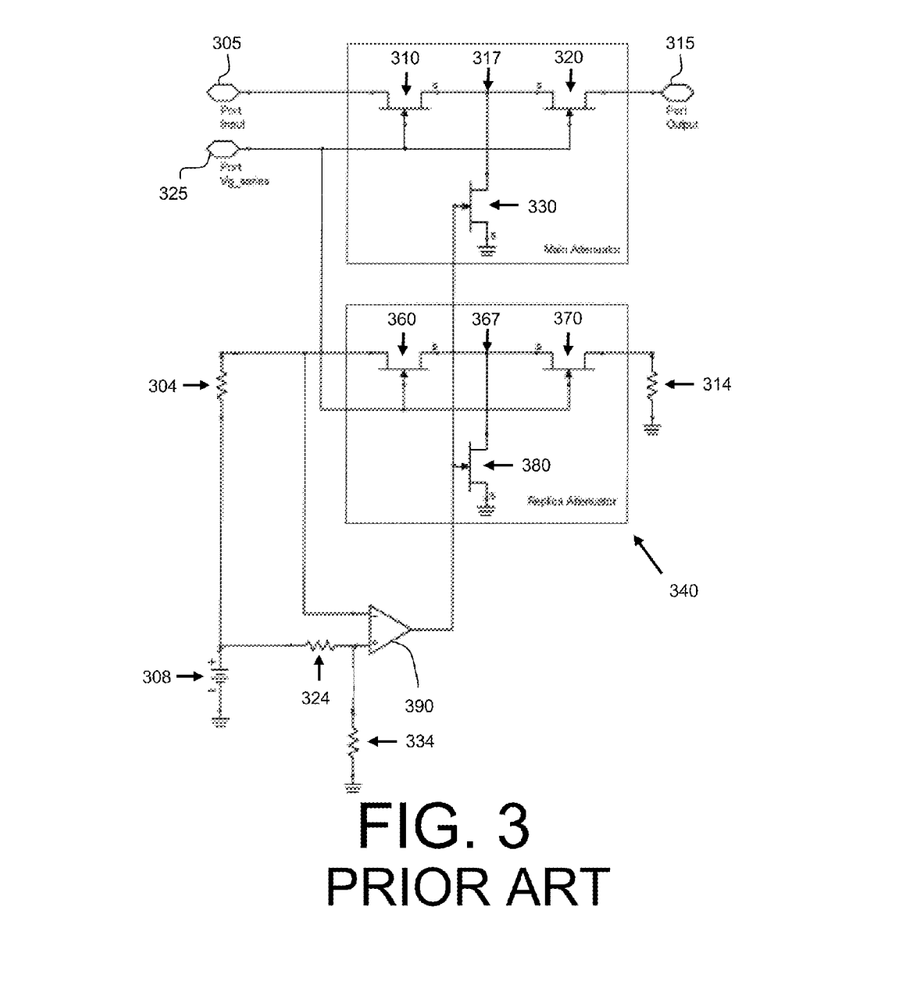
FIG. 3 shows a schematic diagram of yet another attenuator.

FIG. 3 shows a schematic diagram of another attenuator 300 that is also designed to try to address the issue of maintaining a proper relationship between Vg_series and Vg_shunt to achieve desired attenuation values and maintain the input and output impedances within a desired range. Attenuator 300 includes an input port 305 and an output port 315. Attenuator 300 also includes a first series attenuation branch, including a first series field effect transistor 310, connected in series with a second series attenuation branch, including a second series field effect transistor 320, between input port 305 and output port 315 via an intermediate node 317. Also, a shunt attenuation branch including a shunt field effect transistor 330 is connected between intermediate node 317 and ground. Attenuator 300 includes one attenuation control port 325 which receive a series attenuation control signal Vg_series.

Attenuator 300 also includes a "dummy attenuator" or "replica attenuator" 340. Replica attenuator 340 includes a first replica series attenuation branch, including a first replica series field effect transistor 360, connected in series with a second replica series attenuation branch, including a second replica series field effect transistor 370, between replica attenuator input load 304 and replica attenuator output load 314 via an intermediate node 367. Also, a replica shunt attenuation branch including a replica shunt field effect transistor 380 is connected between intermediate node 367 and ground.

Attenuator 300 further includes an operational amplifier 390 having a non-inverting input connected to a supply voltage 308 through a resistor divider comprising resistors 324 and 334. The inverting input of operational amplifier 390 is connected to the replica attenuator input load 304. Operational amplifier 390 can be integrated into the same chip as attenuator field effect transistors 310, 320 and 330, or it can be provided off-chip Operationally, series attenuation control signal Vg_series is provided to control the series field effect transistors 310 and 320, and also to control the replica series field effect transistors 360 and 370. Through feedback operation with replica attenuator 340, operational amplifier 390 outputs a shunt attenuation control signal Vg_shunt to replica shunt field effect transistor 380 to maintain the input and output impedances of replica attenuator 340 to match the impedances of input and output loads 304 and 314. The same shunt attenuation control signal Vg_shunt output by operational amplifier 390 is coupled to shunt field effect transistor 330. By an appropriate selection of scaling for replica field effect transistors 360, 370 and 380 versus attenuator field effect transistors 310, 320 and 330, and for input and output loads 304 and 314 versus the source and load impedances for input and output ports 305 and 315, the operational amplifier 390 will output a value for shunt attenuation control signal Vg_shunt that will maintain the input and output impedances at attenuator 300 at the desired values.

However, attenuator 300 has some drawbacks, including the added size and complexity of replica attenuator 340 and operational amplifier 390.

What is needed, therefore, is a relatively uncomplicated attenuator. What is further needed is an attenuator with a single attenuator control voltage input terminal which is relatively compact and which is relatively insensitive to process and temperature variations.

SUMMARY

In an exemplary embodiment, an attenuator comprises: an input port, an output port, an attenuation control port, and first and second supply voltage. The attenuator also comprises: a first series attenuation branch, including a first field effect transistor, connected between the input port and an intermediate node; a second series attenuation branch, including a second field effect transistor, connected between the node and the output port; a shunt attenuation branch, including a third field effect transistor, connected between the intermediate node and the supply voltage connection, a gate of third field effect transistor receiving the attenuation control signal from the attenuation control port; and a bias control circuit. The bias control circuit comprises a fourth field effect transistor receiving at a gate thereof the attenuation control signal from the attenuation control port, and having a first terminal connected to the first supply voltage, and a resistor connected between a second terminal of the fourth field effect transistor and the second supply voltage. The voltage at the second terminal of the fourth field effect transistor is coupled to gates of the first and second field effect transistors to supply a bias voltage thereto in response to the attenuation control signal.

In another exemplary embodiment, an attenuator comprises: one or more series attenuation branches comprising one or more series field effect transistors, each having a gate; one or more shunt attenuation branches comprising one or more shunt field effect transistors, each having a gate; and a bias control field effect transistor. The bias control field effect transistor receives at its gate a first bias control signal and in response thereto produces at one of its drain and source terminals a second bias control signal. Either the first bias control signal is coupled to the gates of the one or more series field effect transistors, and the second bias control signal is coupled to the gates of the one or more shunt field effect transistors; or the first bias control signal is coupled to the gates of the one or more shunt field effect transistors, and the second bias control signal is coupled to the gates of the one or more series field effect transistors.

In yet another exemplary embodiment, a method is provided for attenuating a signal. The method comprises: providing one or more series attenuation branches comprising one or more series field effect transistors each having a gate; providing one or more shunt attenuation branches comprising one or more shunt field effect transistors each having a gate; receiving a first bias control signal and providing the bias control signal to a bias control field effect transistor; at the bias control field effect transistor, producing from the first bias control signal a second bias control signal having a voltage which changes in an opposite direction with respect to a change in voltage of the first bias control signal; and either: (1) coupling the first bias control signal to the gates of each of the one or more series field effect transistors, and the second bias control signal is applied to the gates of the one or more shunt field effect transistors; or (2) coupling the first bias control signal is to the gates of the one or more shunt field effect transistors, and the second bias control signal is applied to the gates of the one or more series field effect transistors.

BRIEF DESCRIPTION OF THE DRAWINGS

The exemplary embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, SHF and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 4:
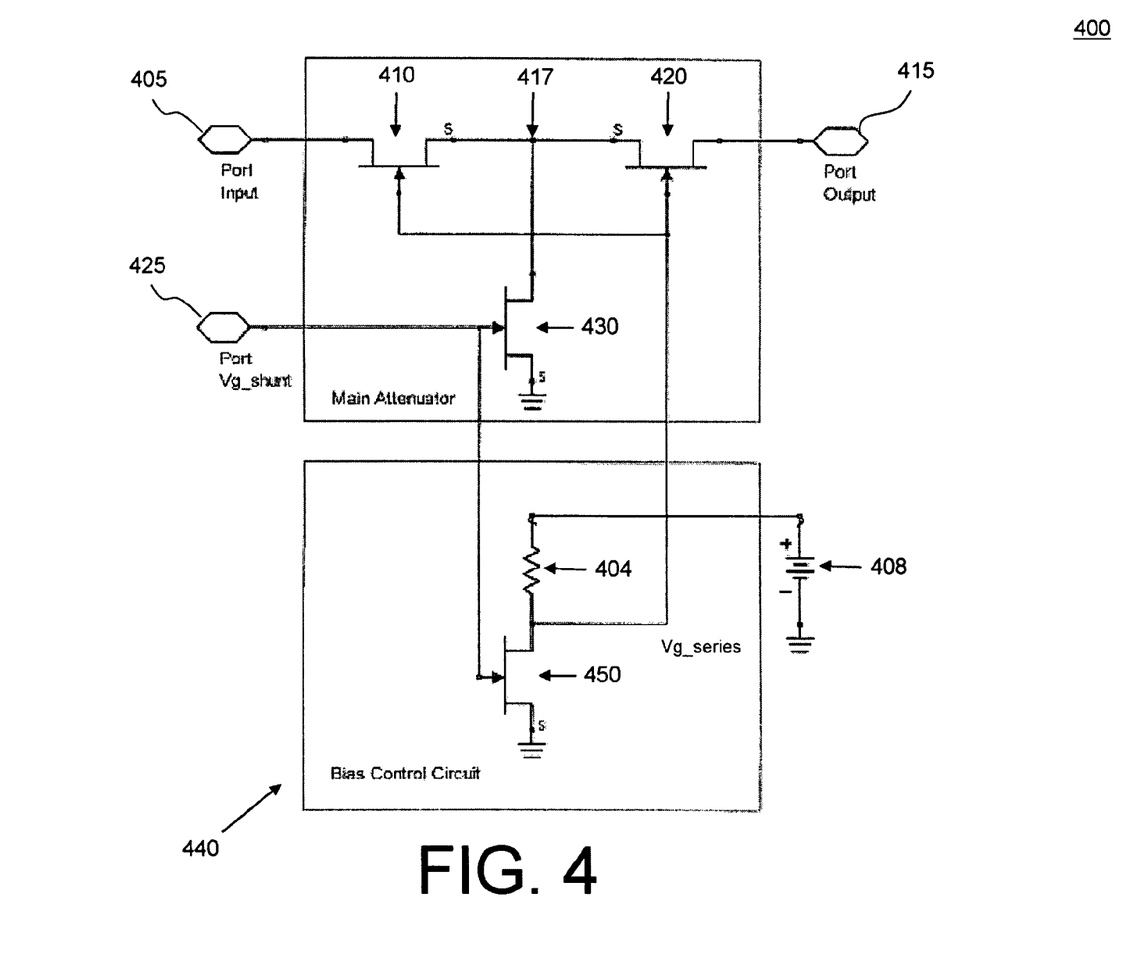
FIG. 4 shows a schematic diagram of one embodiment of an attenuator which has a single attenuation control port.

FIG. 4 shows a schematic diagram of one embodiment of an attenuator 400 which has a single attenuation control port. Attenuator 400 includes an input port 405 and an output port 415. Attenuator 400 also includes a first series attenuation branch, or arm, including a first series field effect transistor 410, connected in series with a second series attenuation branch, or arm, including a second series field effect transistor 420, between input port 405 and output port 415 via an intermediate node 417. Also, a shunt attenuation branch, or arm, including a shunt field effect transistor 430 is connected between intermediate node 417 and ground.

Attenuator 400 includes a single attenuation control port 425 which receives a bias control signal Vg_shunt.

Attenuator 400 also includes a bias control circuit 440. Bias control circuit 440 includes a bias control field effect transistor 450 and a resistor 404, which are connected in series to a supply voltage 408.

As can be seen in FIG. 4, bias control circuit 440 operates to receive a first bias control signal Vg_shunt which is also coupled to shunt field effect transistor 430, and to produce therefrom a second bias control signal Vg_series to be coupled to the gates of first and second series field effect transistors 410 and 420. In particular, the same voltage Vg_shunt which is coupled to the gate of shunt field effect transistor 430 is also coupled to the gate of bias control field effect transistor 450. One terminal (e.g., the drain) of bias control field effect transistor 450 outputs the second bias control signal Vg_series which exhibits a voltage which changes in an opposite direction with respect to a change in voltage of the first bias control signal Vg_shunt which is coupled to the gate of bias control field effect transistor 450.

The exact relationship between the first bias control signal Vg_shunt and second bias control signal Vg_series is governed by proper selection of supply voltage 408, resistor 404, and the size of bias control field effect transistor 450. In particular, the supply voltage 408, resistor 404, and the size of bias control field effect transistor 450 are selected in concert to yield the minimum variation in attenuator port impedance from the desired value, as a function of attenuation value. The selection of supply voltage 408, resistor 404, and the size of bias control field effect transistor 450 to produce the desired characteristics can be easily accomplished by one skilled in the art in a very short time using conventional design tools.

In operation, input port 405 receives an input signal that is to be attenuated. Typically, the input signal is an RF signal. Also, single attenuation control port 425 receives first bias control signal Vg_shunt having a voltage selected to provide a desired attenuation to the input signal. First bias control signal Vg_shunt is coupled to the gate of shunt field effect transistor 430, and also to the gate of bias control field effect transistor 450. The drain of bias control field effect transistor 450 becomes the second bias control signal Vg_series and is coupled to the gates of first and second series field effect transistors 410 and 420. Field effect transistors 410, 420 and 430 operate, in response to corresponding bias control voltages, as voltage controlled impedances. The voltage of the first bias control signal Vg_shunt biases shunt field effect transistor 430 to present a particular shunt impedance to ground for the RF input signal, and the voltage of the second bias control signal Vg_series biases series field effect transistors 410 and 420 each to present a particular series impedance to the RF input signal. As a result of the selected series and shunt impedances of field effect transistors 410, 420 and 430, the RF input signal is attenuated and output at output terminal 415. Furthermore, due to the proper selection of supply voltage 408, resistor 404, and the size of bias control field effect transistor 450, Vg_series is generated such that the input and output impedances of attenuator 400 are set to a desired value (e.g., 50Ω) within a desired tolerance (e.g., 45-63Ω) over the range of attenuation values.

In one particular embodiment: first and second series field effect transistors 410 and 420, and shunt field effect transistor, are each of a size of 200 μm; supply voltage 408 has a voltage of 5V; resistor 404 has a value of 15 kΩ; and bias control field effect transistor 450 has a size of 20 μm.

In a beneficial arrangement, all of the field effect transistors 410, 420, 430 and 450 and resistor 404 are fabricated in a vicinity to each other in an integrated circuit. In this case, process and temperature variations in the attenuator field effect transistors 410, 420 and 430 will be mirrored in bias control field effect transistor 450.

Figure 5:
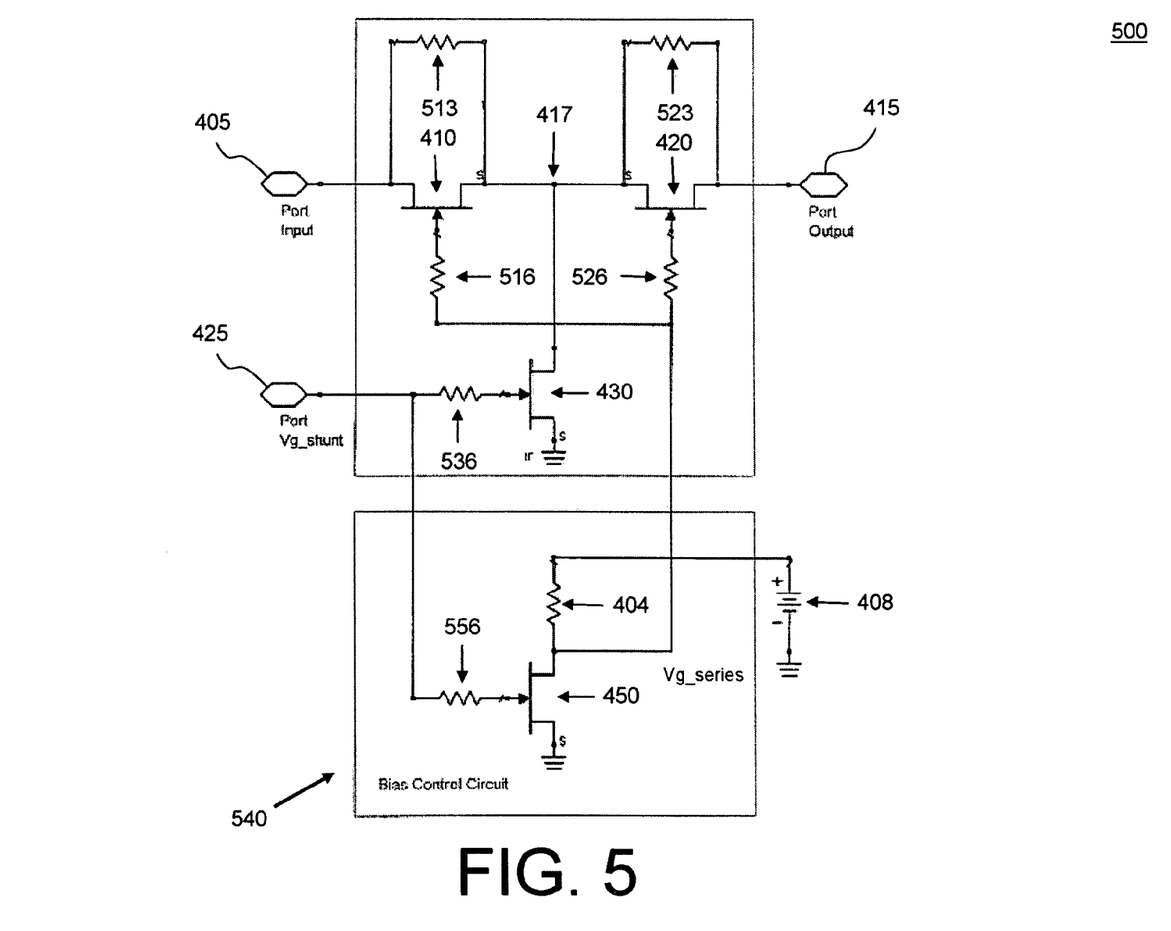
FIG. 5 shows a schematic diagram of another embodiment of an attenuator which has a single attenuation control port.

FIG. 5 shows a schematic diagram of another embodiment of an attenuator 500 which has a single attenuation control port 425. Attenuator 500 is similar to attenuator 400, and like-numbered elements are the same. For brevity, only the differences between attenuator 500 and attenuator 400 will now be described.

In attenuator 500, the first bias control signal Vg_shunt is coupled to the gate of shunt field effect transistor 430 via a corresponding gate resistor 536, and the second bias control signal Vg_series is coupled to the gates of first and second series field effect transistors 410 and 420 via corresponding gate resistors 516 and 526. Also, the first bias control signal Vg_shunt is coupled to the gate of bias control field effect transistor 450 via a corresponding gate resistor 556. Attenuator 500 also includes first and second shunt resistors 513 and 523 each connected in parallel across a source and drain of a corresponding one of the first and second field effect transistors 410 and 420. First and second shunt resistors 513 and 523 allow first and second field effect transistors 410 and 420 to be operated in a pinch-off condition without presenting an undesirably high impedance to the external circuitry. In a beneficial arrangement, resistors 516, 526, 536 and 556 all have relatively high resistance values (e.g., 10 kΩ), and first and second shunt resistors 513 and 523 each have a same value as the desired port impedance (e.g., 50Ω).

Figure 6:
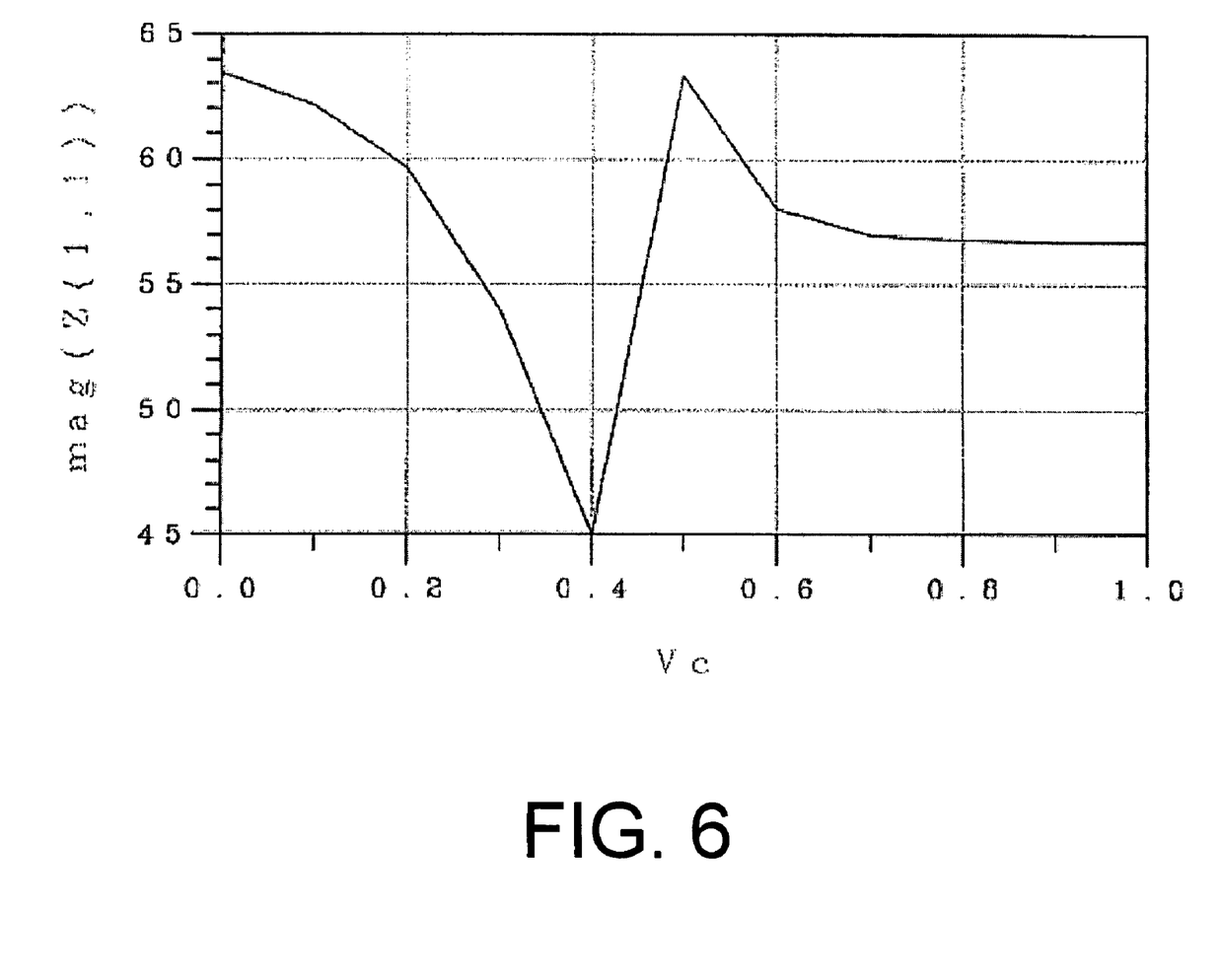
FIG. 6 illustrates an input impedance characteristic of the attenuator of FIG. 5 as a function of attenuator control voltage.

FIG. 6 shows an input port impedance characteristic of the attenuator of FIG. 5 as a function of attenuator control voltage (e.g., Vg_shunt). It can be seen from FIG. 6 that the input impedance only varies from about 45-63Ω across a wide range of attenuation control voltage. This implies a VSWR of less than about 1.3:1, which represents a good match.

Figure 7:
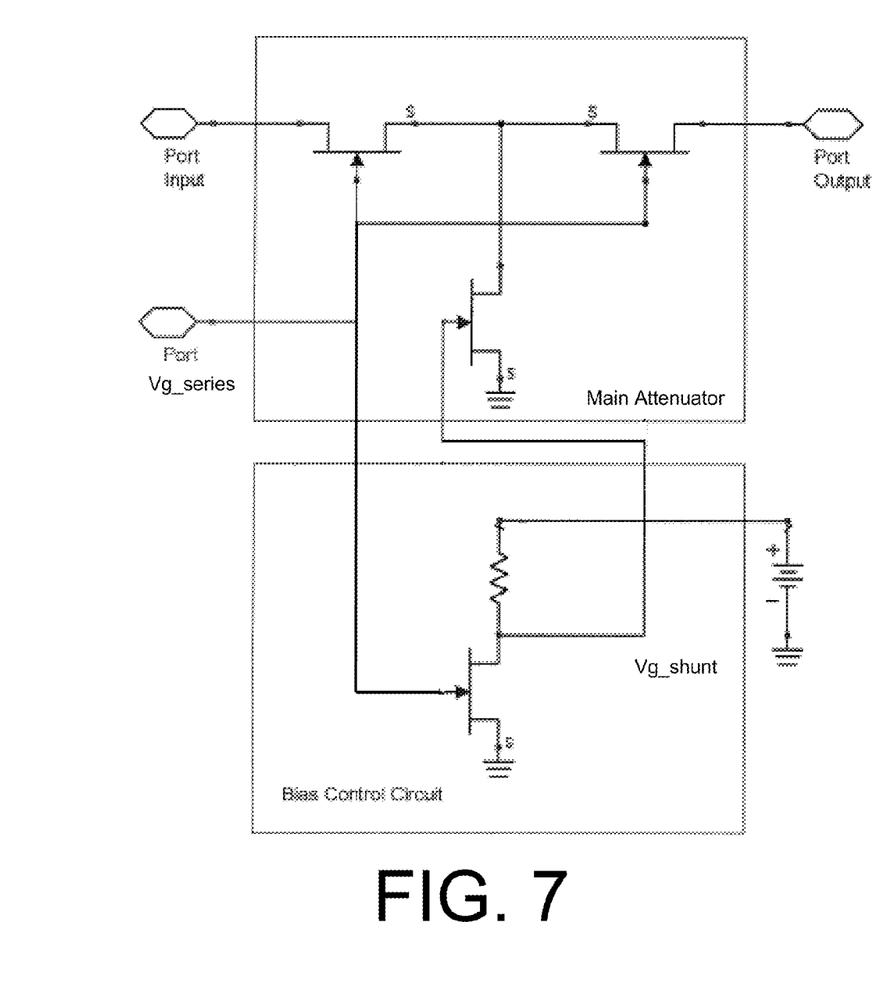
FIG. 7 shows a schematic diagram of yet another embodiment of an attenuator which has a single attenuation control port.

Although the embodiments illustrated in FIGS. 4 and 5 are in a so-called "T" configuration with a single shunt attenuation branch disposed between two series attenuation branches, the invention is not so limited. The attenuator could include additional series and shunt branches while still operating within the principles disclosed above. Also, while the particular embodiment derives a Vg_series bias control voltage for series attenuation transistors from a Vg_shunt bias control voltage for a shunt attenuation transistor, in an alternative arrangement the Vg_series bias control voltage could be applied to a bias control transistor to develop therefrom the Vg_shunt bias control voltage (see, e.g., FIG. 7).

While exemplary embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. An attenuator, comprising:
   an input port, an output port, an attenuation control port, and first and second supply voltages;
   a first series attenuation branch, including a first field effect transistor, connected between the input port and an intermediate node;

a second series attenuation branch, including a second field effect transistor, connected between the node and the output port;

a shunt attenuation branch, including a third field effect transistor, connected between the intermediate node and the first supply voltage connection, a gate of third field effect transistor receiving the attenuation control signal from the attenuation control port; and a bias control circuit, comprising a fourth field effect transistor receiving at a gate thereof the attenuation control signal from the attenuation control port, and having a first terminal connected to the first supply voltage, and a resistor connected between a second terminal of the fourth field effect transistor and the second supply voltage, wherein a voltage at the second terminal of the fourth field effect transistor is coupled to gates of the first and second field effect transistors to supply a bias voltage thereto in response to the attenuation control signal.

2. The attenuator of claim 1, wherein the first series attenuation branch further includes a first resistor connected in parallel across a source and drain of the first field effect transistor, and the second series attenuation branch further includes a second resistor connected in parallel across a source and drain of the second field effect transistor.

3. The attenuator of claim 2, further comprising:
a first gate resistor coupling the bias voltage to the gate of the first field effect transistor;
a second gate resistor coupling the bias voltage to the gate of the second field effect transistor;
a third gate resistor coupling the attenuation control signal to the gate of the third field effect transistor; and
a fourth gate resistor coupling the attenuation control signal to the gate of the fourth field effect transistor.

4. The attenuator of claim 1, further comprising:
a first gate resistor coupling the bias voltage to the gate of the first field effect transistor;
a second gate resistor coupling the bias voltage to the gate of the second field effect transistor;
a third gate resistor coupling the attenuation control signal to the gate of the third field effect transistor; and
a fourth gate resistor coupling the attenuation control signal to the gate of the fourth field effect transistor.

5. The attenuator of claim 1, wherein all of the field effect transistors are fabricated in a vicinity to each other in an integrated circuit.

6. An attenuator comprising:
one or more series attenuation branches comprising one or more series field effect transistors, each having a gate;
one or more shunt attenuation branches comprising one or more shunt field effect transistors, each having a gate; and
one selected from the group consisting of: (1) a bias control field effect transistor which receives at its gate a first bias control signal and in response thereto produces at one of its drain and source terminals a second bias control signal, wherein the first bias control signal is coupled to the gates of the one or more series field effect transistors, and the second bias control signal is coupled to the gates of the one or more shunt field effect transistors; and (2) a bias control field effect transistor which receives at its gate a first bias control signal and in response thereto produces at one of its drain and source terminals a second bias control signal, wherein the first bias control signal is coupled to the gates of the one or more shunt field effect transistors, and the second bias control signal is coupled to the gates of the one or more series field effect transistors.

7. The attenuator of claim 6, wherein each series attenuation branch further includes a series resistor connected in parallel across a source and drain of the series field effect transistor.

8. The attenuator of claim 6, further comprising:
series gate resistors respectively coupling the first or second bias voltage to the gates of the series field effect transistor;
shunt gate resistors respectively coupling the second or first bias voltage to the gates of the shunt field effect transistors; and
a bias control gate resistor coupling the first bias control signal to the gate of the bias control field effect transistor.

9. The attenuator of claim 6, wherein the first bias control signal is coupled to the gates of the one or more series field effect transistors, and the second bias control signal is coupled to the gates of the one or more shunt field effect transistors.

10. The attenuator of claim 6, wherein the first bias control signal is coupled to the gates of the one or more shunt field effect transistors, and the second bias control signal is coupled to the gates of the one or more series field effect transistors.

11. The attenuator of claim 6, further comprising a resistor connecting one of its drain and source terminals of the bias control field effect transistor to a supply voltage.

12. The attenuator of claim 6, wherein all of the field effect transistors are fabricated in a vicinity to each other in an integrated circuit.

13. A method of attenuating a signal, the method comprising:
providing one or more series attenuation branches comprising one or more series field effect transistors, each having a gate;
providing one or more shunt attenuation branches comprising one or more shunt field effect transistors, each having a gate;
receiving a first bias control signal and providing the bias control signal to a bias control field effect transistor;
at the bias control field effect transistor, producing from the first bias control signal a second bias control signal having a voltage which changes in an opposite direction with respect to a change in voltage of the first bias control signal; and
one selected from the group consisting of: (1) coupling the first bias control signal to the gates of each of the one or more series field effect transistors, and the second bias control signal is applied to the gates of the one or more shunt field effect transistors; and (2) coupling the first bias control signal to the gates of the one or more shunt field effect transistors, and the second bias control signal is applied to the gates of the one or more series field effect transistors.

14. The method of claim 13, further comprising providing in each series attenuation branch a series resistor connected in parallel across a source and drain of the series field effect transistor.

15. The method of claim 13, further comprising:
coupling the first or second bias voltage to the gates of the series field effect transistor via corresponding series gate resistors;
coupling the second or first bias voltage to the gates of the shunt field effect transistors via corresponding shunt gate resistors; and coupling the first bias control signal to the gate of the bias control field effect transistor via a bias control gate resistor.

16. The method of claim 13, wherein the first bias control signal is coupled to the gates of the one or more series field effect transistors, and the second bias control signal is coupled to the gates of the one or more shunt field effect transistors.

17. The method of claim 13, wherein the first bias control signal is coupled to the gates of the one or more shunt field effect transistors, and the second bias control signal is coupled to the gates of the one or more series field effect transistors.

18. The method of claim 13, further comprising providing a resistor connecting one of its drain and source terminals of the bias control field effect transistor to a supply voltage.

19. The method of claim 13, wherein further comprising providing all of the field effect transistors in a vicinity to each other in an integrated circuit.

* * * * *